(12) United States Patent
Anderson

(10) Patent No.: US 6,412,641 B1
(45) Date of Patent: Jul. 2, 2002

(54) PACKAGING FOR ENCAPSULATED DICE EMPLOYING EMR-SENSITIVE ADHESIVES

(75) Inventor: Charles Anderson, Los Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/597,782

(22) Filed: Jun. 19, 2000

(51) Int. Cl.⁷ .............................................. B65D 85/30
(52) U.S. Cl. ...................................... 206/714; 206/460
(58) Field of Search .............................. 206/713–718, 206/724, 725, 460, 820, 813

(56) References Cited

U.S. PATENT DOCUMENTS

| | | | |
|---|---|---|---|
| 4,966,281 A | * 10/1990 | Kawanishi et al. | 206/714 |
| 5,089,314 A | * 2/1992 | Masujima et al. | 206/714 |
| 5,203,143 A | * 4/1993 | Gutentag | 206/714 |
| 5,590,787 A | * 1/1997 | Hodges | 206/724 |
| 5,765,692 A | * 6/1998 | Schenz | 206/713 |
| 5,769,237 A | * 6/1998 | Althouse et al. | 206/714 |
| 5,775,510 A | * 7/1998 | Hodges | 206/724 |

* cited by examiner

Primary Examiner—Luan K. Bui

(57) ABSTRACT

A structure and method for protecting encapsulated semiconductor integrated microcircuit dice during shipping. The structure secures the position of the encapsulated die or dice atop an EMR-penetrable element using an adhesive layer, the stickiness, adhesiveness or coefficient of friction of which is alterable by exposure to EMR of a predetermined wavelength range, such as ultraviolet light. Once the structure reaches its destination, prior to removal of the packaged dice, the adhesive layer is exposed to EMR, such as ultraviolet light, through the element. This exposure reduces the stickiness, adhesiveness, or coefficient of friction of the adhesive to facilitate encapsulated die removal. The EMR-sensitive adhesive does not leave contaminating silicon residue on the removed encapsulated die.

8 Claims, 3 Drawing Sheets

PACKAGING FOR ENCAPSULATED DICE EMPLOYING EMR-SENSITIVE ADHESIVES

TECHNICAL FIELD

This invention relates to semiconductor integrated microcircuit manufacturing and more particularly to temporarily packaging encapsulated integrated circuit dice for shipping.

BACKGROUND ART

Semiconductor integrated circuit chips are typically constructed en masse on a single wafer or other substrate of silicon or other semiconductor material. After the circuits are created, the wafers or substrates are split up, or "singulated", into individual integrated circuit chips or dice. Typically, each die is then individually encapsulated into integrated circuit packages which are capable of being attached to printed circuit boards. Encapsulated dice are often sold or transferred to other manufacturing sites. The encapsulated dice must therefore be shipped through the mail or by other freight means to destinations which can be cities, states or even countries apart. Freight travel often involves subjecting articles so transported to a harsh, contaminant-laden environment in terms of dirt and dust, as well as mechanical shock and vibration. This environment requires that the encapsulated dice be temporarily packaged to protect them from such exposure.

Over the years, the electronic industry has developed packages called carrier tapes which temporarily contain the dies during shipping. In general, carrier tapes that are used to transport components from a component manufacturer to a different manufacturer that assembles the components into new products are well known. For example, in the field of electronic circuit assembly, electronic components are often carried from a supply of such components to a specific location on a circuit board for attachment thereto. The components may be of several different types, including surface mount components. Particular examples include memory chips, integrated circuit chips, resistors, connectors, dual in-line processors, capacitors, gate arrays, etc. Such components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of the robotic placement machine, a continuous supply of electronic components must be furnished to the machine.

One way to provide a continuous supply of electronic components to a desired location is to use a carrier tape. Conventional carrier tapes generally comprise an elongated plastic strip (often referred to as the carrier) that has a series of identical pockets formed at predetermined, uniformly spaced intervals along the length of the strip. The pockets are designed to receive an electronic component. A continuous cover (often referred to as a cover tape) is applied over the elongated strip to retain the components in the pockets. The carrier tape is fed to the robotic placement machine that strips the continuous cover tape from the carrier and removes the components from the pockets and places them onto the circuit board.

A need exists for packaging and methods for inexpensively protecting encapsulated dice during shipping from contamination and damage, as well as facilitating removal of the encapsulated dice from packaging upon reaching their destination.

BRIEF SUMMARY OF THE INVENTION

The present invention provides a structure having an ultraviolet (UV) light or other electromagnetic radiation (EMR) transmissive or penetrable plate upon which has been placed a layer of UV light or other EMR-sensitive adhesive for securing the position of the encapsulated die or dice during shipping. The adhesive is sensitive to selected, predetermined wavelengths of EMR in that its adhesiveness, stickiness or coefficient of friction is alterable by exposing the adhesive to such selected wavelengths of EMR, such as UV light. Upon arrival of the structure at its destination, the adhesive is subjected to an EMR source emitting such radiation within the selected wavelengths, thereby reducing its adhesiveness, and allowing for less powerful pickup of the encapsulated dice during removal. The present invention may be embodied in the form of a tape-and-reel transport system for encapsulated dice.

According to one aspect of the invention, provided is a method method for loading, carrying and dispensing encapsulated semiconductor dice, comprising:

adhering a plurality of encapsulated dice in spaced relationship along an elongated tape element;

winding said elongated tape element on a reel;

unwinding said elongated tape element;

exposing said adhered singulated dice to EMR within a predetermined wavelength range and reducing the adherence of said adhered encapsulated dice to said tape element responsive to said EMR exposure.

Another aspect of the present invention provides a flexible carrier tape for storage and delivery of encapsulated die by an advancement mechanism, the carrier tape comprising:

a strip portion having a plurality of aligned pockets for carrying the encapsulated die, the pockets being spaced along the strip portion and having a bottom and opening through a top surface thereof; and, an electromagnetic radiation sensitive material disposed on the bottom of the pockets for affixing the encapsulated die thereto.

Other objects and aspects of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

DETAILED DESCRIPTION OF THE INVENTION

Figure 1:
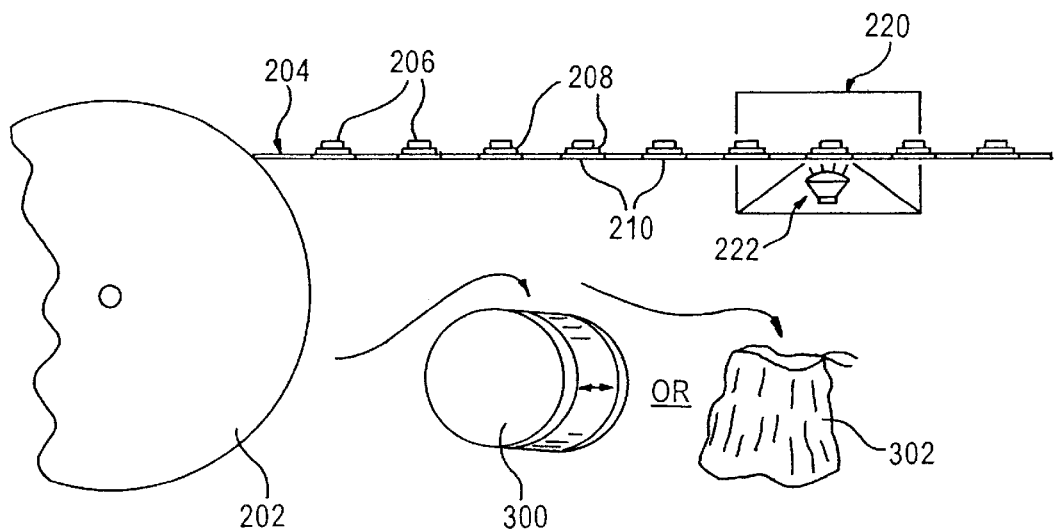
FIG. 1 is a schematic side sectional elevation of a tape-and-reel encapsulated die transport assembly and associated EMR chamber according to the invention.

FIG. 1 depicts a tape-and-reel transport assembly 200, herein illustrated with reel 202 feeding a continuous carrier tape 204 bearing a plurality of encapsulated dice 206 secured by EMR-sensitive adhesive segments 208 over ENR-penetrable windows 210 (elements 206, 208 and 210 shown enlarged for clarity) in carrier tape 204 into an EMR chamber 220 to effect release of the encapsulated dice 206 through sequential exposure to an EMR source 222 within chamber 220. Carrier tape 204 comprises a material which is penetrable by (i.e., transmits) ultraviolet (UV) light, such as substantially clear plastic, glass or polycarbonate. EMR source 222 is preferably placed below and aimed upwardly through carrier tape 204 as it passes through EMR chamber 220. EMR source 222 may be continuously activated, intermittently activated responsive to the presence of a carrier tape-adhered encapsulated die thereover, or continuously activated but shielded by a shutter structure until such time as a carrier tape-adhered encapsulated die is disposed thereover. Upon arrival of the tape and reel at its destination, the UV-sensitive adhesive is subjected to a UV light of sufficient intensity. The exposure reduces the coefficient of friction of the adhesive and the encapsulated die can then be easily removed through vacuum pick-up means. Reel 202 carrying a tape 204 bearing encapsulated dice 206 adhered thereto and wound around reel 202 would typically be disposed for transport in a case 300 as known in the art, or at least in an EMR-opaque antistatic bag 302 (both shown in reduced size in FIG. 11). In this embodiment, UV-sensitive adhesives and a UV EMR source are employed. In this embodiment, the adhesive layer is formed using ultraviolet sensitive tape (UV tape) of the type which is currently used to hold IC wafers firmly in place during the singulation process. UV tape typically comprises a layer of ultraviolet curable, pressure sensitive adhesive such as acrylic attached to a UV-penetrable polyvinyl chloride backing.

UV tape is currently available from suppliers such as Kanematsu USA, Inc., of New York, N.Y. under the brand name Furukawa UV Tape; Uniglobe Kisco Co., of Santa Clara, Calif., under the brand name Bando Dicing Tape; and others. Although UV-sensitive adhesive tape is the preferred adhesive, other EMR-sensitive adhesives such as glues and gels may be used in place of the UV tape without departing from the invention.

In general, any means for containing the dice may be used without departing from the invention so long as those means allow for the penetration of electromagnetic radiation which will reduce the coefficient of friction of the adhesive layer.

The pre-exposure stickiness, level of adhesion or coefficient of friction of the UV-sensitive adhesive should generally be strong enough to securely hold the encapsulated dice during the rigors of shipping, and be weak enough after exposure and curing to allow for vacuum pick-up. The adhesive should not contain a significant concentration of any undesirable compounds which would result in contamination of the encapsulated die or dice.

Although UV light is used in the preferred embodiment, other types of electro-magnetic radiation may be used so long as the plate portion is penetrable by it, and the adhesive layer is sensitive to it. For the commercially available UV-sensitive adhesive tape disclosed above and for most clear plastic, glass or polycarbonate, UV light having a wavelength of between 250 and 350 nanometers has been found to be adequate. UV sensitive adhesives by different manufacturers are responsive to different but largely overlapping wavelength ranges, and the invention may thus be practiced effectively with such different adhesives using a wide-spectrum UV source.

Figure 2A:
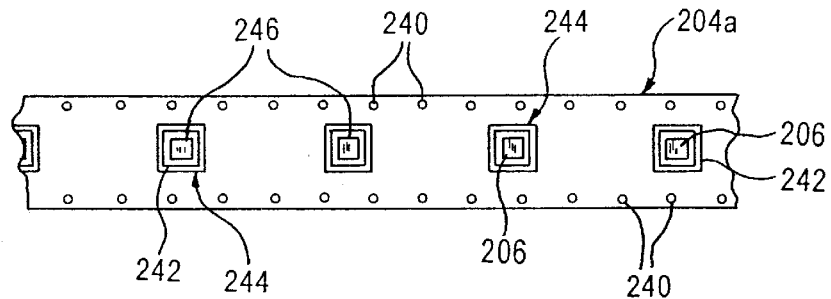
FIGS. 2A and 2B are schematic top views of two encapsulated die-support tapes of different design employing EMR-sensitive adhesives in different patterns.
Figure 2B:
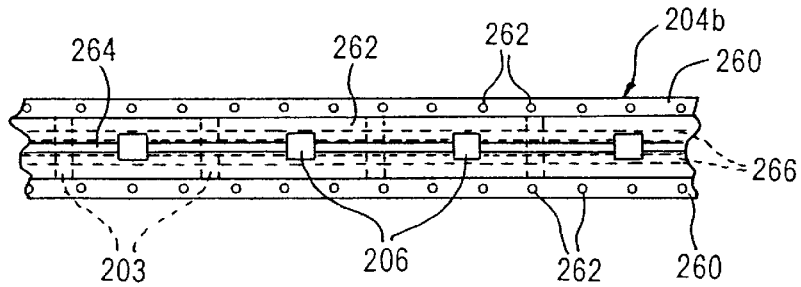

FIGS. 2A and 2B depict several variations in the structure of carrier tape 204 according to the invention. FIG. 2A illustrates a carrier tape 204a having indexing holes 240 at equal intervals along each lateral edge thereof for precise, controlled movement of tape 204a by indexing pins or sprockets as known in the art, such feature being conventional. As tape handling equipment for TAB (tape automated bonding) operations is conventionally most often designed to handle either 35 mm or 70 mm wide tape (depending upon packaged die size), it is contemplated, although not required, that the present invention might be practiced with tapes of those widths so as to facilitate use of existing equipment. Tape 204a may be substantially comprised of a flexible, EMR-opaque metallic or non-metallic (such as synthetic resin) material, and includes EMR-transmissive segments 242 formed therein or placed over apertures formed therein at encapsulated die placement locations 244. Segments 242 carry an EMR-sensitive adhesive patch 246 on their upper, or carrier, surfaces. Encapsulated dice 206 are then placed on adhesive patches 246, adhering thereto until they are subsequently released by selective EMR exposure, as previously described. After adherence of encapsulated dice 206, tape 204a is then wound about a reel 202 for transport, reel 202 then being typically placed in reel case 300 or an EMR-opaque anti-static bag 302. Segments 242 and adhesive patches 246 may be embodied in several ways. For example, segment 242 may comprise an adhesive-coated tape as previously mentioned. Alternatively, adhesive 246 may comprise dots, crosses or X's of adhesive applied through a stencil or by a printing head, or sprayed, onto segments 242.

FIG. 2B depicts a carrier tape 204b comprised of two robust, mutually parallel edge strips 260 containing indexing holes 240, with a continuous intervening encapsulated die support strip 262 of EMR-transmissive material disposed therebetween. The entire tape 204b or only encapsulated die support strip 262 may be formed of EMR-transmissive material, as desired or required. The edge strips 260 may be of greater thickness than encapsulated die support strip 262 to eliminate stretching of tape 204b, and to facilitate the use of a thinner, and thus more EMR-transmissive segment for encapsulated die support strip 262. Further, edge strips 260 may extend above the upper surface of support strip 262 so as to provide a recessed channel for containing and protecting encapsulated dice 206 when tape 204b is wound on reel 202. If desired, transversely-extending brace members 263 may extend between edge strips 260 to stabilize the encapsulated die support areas and reduce the tendency of carrier tape 204b to flex when the encapsulated dice adhered thereto are retrieved. An EMR-sensitive adhesive may be applied to encapsulated die support strip 262 in the manner described with respect to FIG. 2A, or, as depicted, may comprise a single continuous adhesive strip 264 or two mutually parallel adhesive strips 266 (shown in broken lines).

Figure 3:
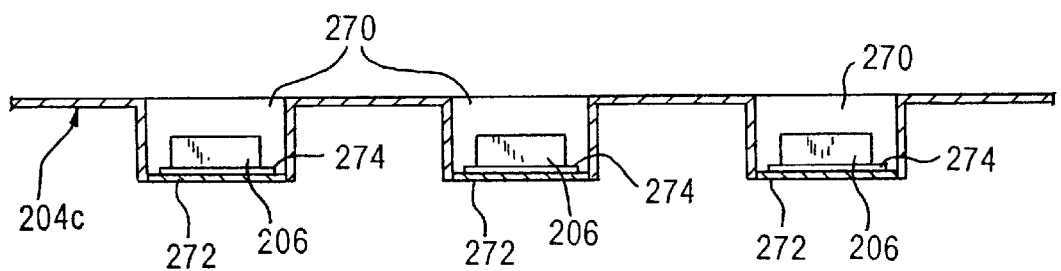
FIG. 3 is an enlarged side sectional view of an encapsulated die-support tape including encapsulated die containment cavities.

FIG. 3 depicts an enlarged side sectional view of a segment of a tape 204c, depicting encapsulated die containment cavities 270 having EMR-penetrable bottoms 272 for carrying and enclosing encapsulated dice 206 adhered to EMR-sensitive adhesive material 274. When wound on a reel 202, cavities 270 will protect encapsulated dice 206 on tape 204c against damage and contamination. It should be noted that conventional tape structures employing cavities typically require a lid or shutter over the mouth of each cavity to prevent the enclosed encapsulated die from falling out, which requirement is eliminated by the present invention.

Figure 4:
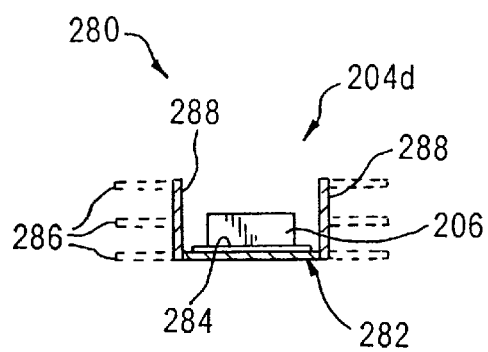
FIG. 4 is a transverse cross-sectional view of an encapsulated die-support tape defining a continuous channel for receiving dice therein.

FIG. 4 depicts a transverse cross-sectional view of a tape 204d defined by a central channel-shaped member 280, at least the bottom 282 of which is comprised in whole or in segments of an EMR-transmissive material. Longitudinally-spaced dots or segments or a continuous strip or strips of EMR-sensitive adhesive material 284 are applied to bottom 282 inside channel shaped member 280. Packaged dice 206 are carried on adhesive material 284, protected within the confines of channel-shaped member 280. Lateral flanges 286 extend transversely to tape 204*d* along the length thereof, and may be placed at the upper, midportion or lower extents of the channel sidewalls 288 as shown in broken lines. Flanges 286 may include apertures for engagement by tape-handling mechanisms.

Figure 5:
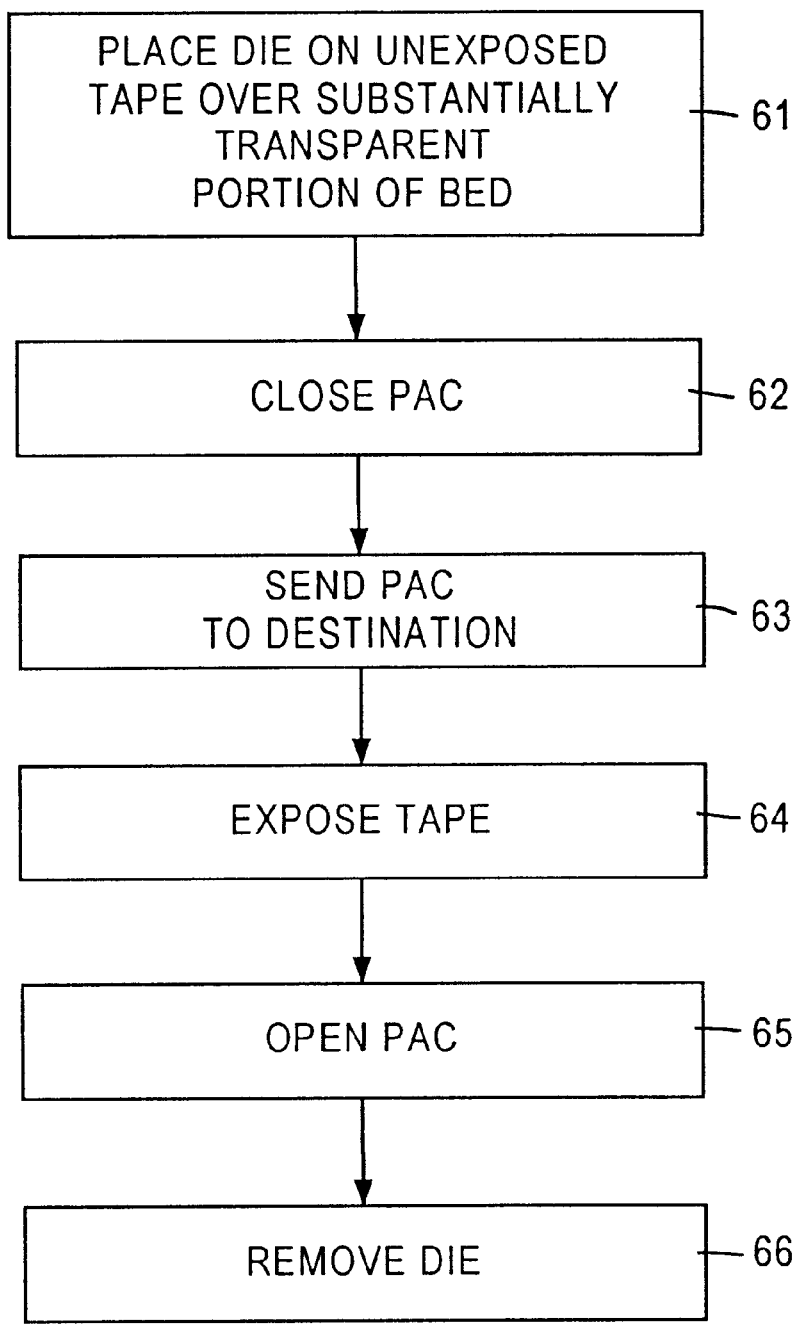
FIG. 5 is a block diagram of the steps necessary for shipping encapsulated dice packaged in carrier tape according to the invention.

FIG. 5 shows exemplary process steps for transporting or shipping an encapsulated die according to the invention. The process begins with placing 61 the encapsulated die on an unexposed UV-sensitive layer of adhesive such as UV tape attached to the upper surface of a substantially transparent portion of a bed. The term "substantially transparent" in this specification means that the portion is capable of passing through UV light with a satisfactorily low amount of attenuation. The next step involves enclosing 62 the encapsulated die within the tape and sending 63 the tape to its destination. During transport, the tape should not be irradiated by any UV light source. This is usually accomplished by placing the wound carrier tape within an opaque antistatic bag. Upon arrival, there are the steps of: exposing 64 a portion of the tape existing between the encapsulated die and the substantially transparent portion of the bed to electromagnetic radiation in the form of ultraviolet light; opening 65 the tape (if a cover is used); and removing 66 the encapsulated die from the tape. The exposing step may occur before or after the opening step.

While the preferred embodiments of the invention have been described, additions, deletions and modifications may be made to those illustrated, features of different embodiments combined, and other embodiments devised, without departing from the spirit of the invention and the scope of the appended claims.

What is claimed:

1. A flexible carrier tape for storage and delivery of encapsulated die by an advancement mechanism, the carrier tape comprising:

a strip portion having a plurality of aligned pockets for carrying the encapsulated die, the pockets being spaced along the strip portion and having a bottom and opening through a top surface thereof; and, an electromagnetic radiation sensitive material disposed on the bottom of the pockets for affixing the encapsulated die thereto, wherein the strip portion has first and second parallel longitudinal edge surfaces with a thickness greater than a thickness of a center portion.

2. The flexible carrier tape of claim 1, wherein each pocket comprises:

four side walls each at generally right angles with respect to each adjacent side wall, the side walls adjoining and extending downwardly from the strip portion; and wherein the bottom wall adjoining the side walls to form the pocket comprises an electromagnetic radiation penetrable material.

3. The flexible carrier tape according to claim 1, wherein each of the pockets is essentially identical and equally spaced along the strip portion.

4. The flexible carrier tape according to claim 1, wherein at least one of the edge surfaces includes a plurality of equally spaced holes for receiving the advancement mechanism.

5. The flexible carrier tape according to claim 1, further comprising a cover that is sufficiently transparent to permit visual inspection of components carried by the carrier tape without removing the cover.

6. The flexible carrier tape according to claim 1, further including an electronic components in at least one of the pockets.

7. The flexible carrier tape according to claim 5, further comprising an aperture to facilitate removal of a component stored in pocket.

8. The flexible carrier tape of claim 5, which does not require a lid or shutter over a mouth of each cavity to prevent an enclosed encapsulated die from falling out.

\* \* \* \* \*